United States Patent
Prasad et al.

(10) Patent No.: US 8,284,626 B2
(45) Date of Patent: Oct. 9, 2012

(54) VOLTAGE COMPENSATED TRACKING CIRCUIT IN SRAM

(75) Inventors: Ravi Shankar Prasad, Patna (IN);
Parvinder Kumar Rana, Ambala (IN)

(73) Assignee: Texas Instruments Incorporated, Dallas, TX (US)

( * ) Notice: Subject to any disclaimer, the term of this patent is extended or adjusted under 35 U.S.C. 154(b) by 298 days.

(21) Appl. No.: 12/719,616

(22) Filed: Mar. 8, 2010

(65) Prior Publication Data

US 2011/0216618 A1    Sep. 8, 2011

(51) Int. Cl.
*G11C 7/00* (2006.01)
(52) U.S. Cl. ............ 365/226; 365/194; 365/189.11
(58) Field of Classification Search .......... 365/194, 365/226, 205, 233.1, 189.11
See application file for complete search history.

(56) References Cited

U.S. PATENT DOCUMENTS 7,499,347 B2 * 3/2009 Chen et al. ............ 365/194
7,787,317 B2 * 8/2010 Wang ..................... 365/200

* cited by examiner

*Primary Examiner* — David Lam
(74) *Attorney, Agent, or Firm* — Wade J. Brady, III; Frederick J. Telecky, Jr.

(57) ABSTRACT

Supply voltage compensated tracking circuit in a split-rail static random access memory (SRAM). The circuit includes a tracking circuit for tracking a delay required for generating sense amplifier enable (SE) signal in a memory. The tracking circuit receives an array supply voltage (VDDAR) and a periphery supply voltage (VDDPR). Further, the circuit includes a discharge control circuit, operatively coupled to the tracking circuit, for increasing delay in activating a first transistor of the tracking circuit when VDDAR is higher than VDDPR; and a contention circuit including an output coupled to the first transistor, for delaying a discharge path activation through the first transistor when VDDAR is lower than the VDDPR.

17 Claims, 5 Drawing Sheets

600

| CONVENTIONAL TRACKING CIRCUIT | | | | |
|---|---|---|---|---|
| VOLTAGE CORNER | 1.26-1.08 | 0.99-1.08 | 0.75-1.26 | 0.75-1.08 |
| AVERAGE POTENTIAL DIFFERENCE | 34.62 mV | 48.94 mV | 83.09 mV | 70.13 mV |
| STANDARD DEVIATION | 10.6 | 12.97 | 27.81 | 23.44 |
| AVERAGE - 3 SIGMA | 2.81 mV | 9.73 mV | -0.35 | -0.19 |
| FOM | 3.27 | 3.75 | 2.99 | 2.99 |

← 605

| TRACKING CIRCUIT ACCORDING TO THE INVENTION | | | | |
|---|---|---|---|---|
| VOLTAGE CORNER | 1.26-1.08 | 0.99-1.08 | 0.75-1.26 | 0.75-1.08 |
| AVERAGE POTENTIAL DIFFERENCE | 37.48 mV | 49.20 mV | 130.64 mV | 100.47 |
| STANDARD DEVIATION | 11.03 | 13.41 | 30.43 | 27.12 |
| AVERAGE - 3 SIGMA | 4.38 mV | 8.98 mV | 39.36 mV | 19.11 |
| FOM | 3.4 | 3.67 | 4.29 | 3.7 |

← 610

| CONVENTIONAL TRACKING CIRCUIT (OPTIMIZED TO MEET FOM) | | | | |
|---|---|---|---|---|
| VOLTAGE CORNER | 1.26-1.08 | 0.99-1.08 | 0.75-1.26 | 0.75-1.08 |
| AVERAGE POTENTIAL DIFFERENCE | 38.31 mV | 52.95 mV | 89.89 mV | 76.28 mV |
| STANDARD DEVIATION | 11.01 | 13.52 | 27.8 | 23.71 |
| AVERAGE - 3 SIGMA | 5.27 mV | 12.37 mV | 6.47 mV | 5.14 mV |
| FOM | 3.48 | 3.91 | 3.23 | 3.21 |

← 615

| PERFORMANCE/POWER IMPACT | | | |
|---|---|---|---|
| VOLTAGE CORNER | ORIGINAL OPTIMIZED | PROPOSED | % AGE IMPACT |
| 0.99-1.08 CORNER | | | |
| WL TO ENABLE | 125.4 ps | 105.40ps | 18.98% |
| AVERAGE POTENTIAL DIFFERENCE | 52.95mV | 49.20mV | 7.62% |

VOLTAGE COMPENSATED TRACKING CIRCUIT IN SRAM

TECHNICAL FIELD

Embodiments of the invention relate generally to memory and more particularly to a tracking circuit in a split-rail static random access memory (SRAM).

BACKGROUND

A split-rail SRAM includes two power supplies namely periphery supply voltage (VDDPR) and array supply voltage (VDDAR) and these supply voltages may vary in an uncorrelated manner which impacts a delay of a tracking circuit responsible for generating sense enable (SE) signal. The tracking circuit tracks the delay required for generating SE signal when minimum sufficient voltage is established across bit lines. If SE signal is generated before the minimum sufficient voltage developed, there are chances of a READ operation failure.

A conventional tracking circuit 100 is illustrated in FIG. 1. The tracking circuit 100 includes two dummy cells which models column parasitic resistance and capacitance (RC) (dummy column 125) and row parasitic RC (dummy row 130) to track the rows and column discharge delay across voltage corners. Initially, point A 107 is pulled high and with the clock going high and point B 109 is pulled low using an internal signal generated from clock generator 135. With point B going low, the parasitic capacitance starts to discharge imitating fraction of discharge time the actual bit line takes to discharge.

The rate of discharge current is controlled by two parallel paths using NMOS transistor 105 and NMOS transistors 110, 115 which decides the discharge current through each path. The gates of these NMOS transistors 110, 115 are connected to one of the supply voltages, VDDAR and VDDPR. Depending on the supply voltage value, the rate of discharge varies which in turn decides the time for generating SE signal 140. When a discharge path is tuned to one voltage corner, it either results in considerable power and performance loss and acceleration of SE signal generation in the other voltage corner. In the latter case, SE signal is generated before a sufficient minimum differential voltage is established across bit lines which is required by sense amplifier to correctly sense and resolve to digital output. This increases the possibility of READ failure.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An exemplary embodiment provides a circuit for compensating a tracking delay across voltage corners in a memory. The circuit includes a tracking circuit for tracking a delay required for generating sense amplifier enable (SE) signal in a memory. The tracking circuit receives an array supply voltage (VDDAR) and a periphery supply voltage (VDDPR). Further the circuit includes a discharge control circuit, operatively coupled to the tracking circuit, for increasing delay in activating a first transistor of the tracking circuit when VDDAR is higher than VDDPR; and a contention circuit including an output coupled to the first transistor, for delaying a discharge path activation through the first transistor when VDDAR is lower than the VDDPR.

An exemplary embodiment provides a discharge control circuit in a split-rail static random access memory (SRAM). The discharge control circuit includes a plurality of inverters for increasing delay in activating a transistor of a tracking circuit according to a relative difference between VDDAR and VDDPR; and a contention circuit that generates a delay in activating a discharge path through the transistor of the tracking circuit when the VDDAR is lower than the VDDPR. The contention circuit includes a first transistor, a second transistor, a third transistor, and a fourth transistor coupled to each other. A low VDDAR activates the third transistor that creates a contention between the contention circuit and the plurality of inverters.

An exemplary embodiment provides a method for compensating a tracking delay across voltage corners in a memory. A relative difference between VDDAR and VDDPR is determined. Further, a delay is generated that activates a discharge path of a tracking circuit in the memory according to the relative difference.

Other aspects and example embodiments are provided in the Drawings and the Detailed Description that follows.

BRIEF DESCRIPTION OF THE VIEWS OF DRAWINGS

FIG. 6 is a table illustrating the statistical mismatch simulation of the tracking circuit of FIG. 2.

DETAILED DESCRIPTION OF THE EMBODIMENTS

Embodiments described herein provide system and method for compensating a tracking delay across voltage corners in a memory. One embodiment provides a tracking circuit that maintains optimum tracking delay across various voltage corners. Another embodiment provides a discharge control circuit in a memory that controls the discharge path of the tracking circuit. Various embodiments are explained considering a split-rail SRAM as an example. However, it will be appreciated that various embodiments described herein may be extended to other types of memories that use the split-rail power supply. In various embodiments, a voltage corner includes relative difference between periphery supply voltage (VDDPR) and array supply voltage (VDDAR) in the SRAM. For illustrative purposes values suitable for some voltage corners, the tracking circuit is designed to operate are provided, for example, 0.99 V-1.08 V (VDDPR-VDDAR), 0.75V-1.26V (VDDPR-VDDAR), and 1.26V-1.08V (VDDPR-VDDAR).

Figure 1:
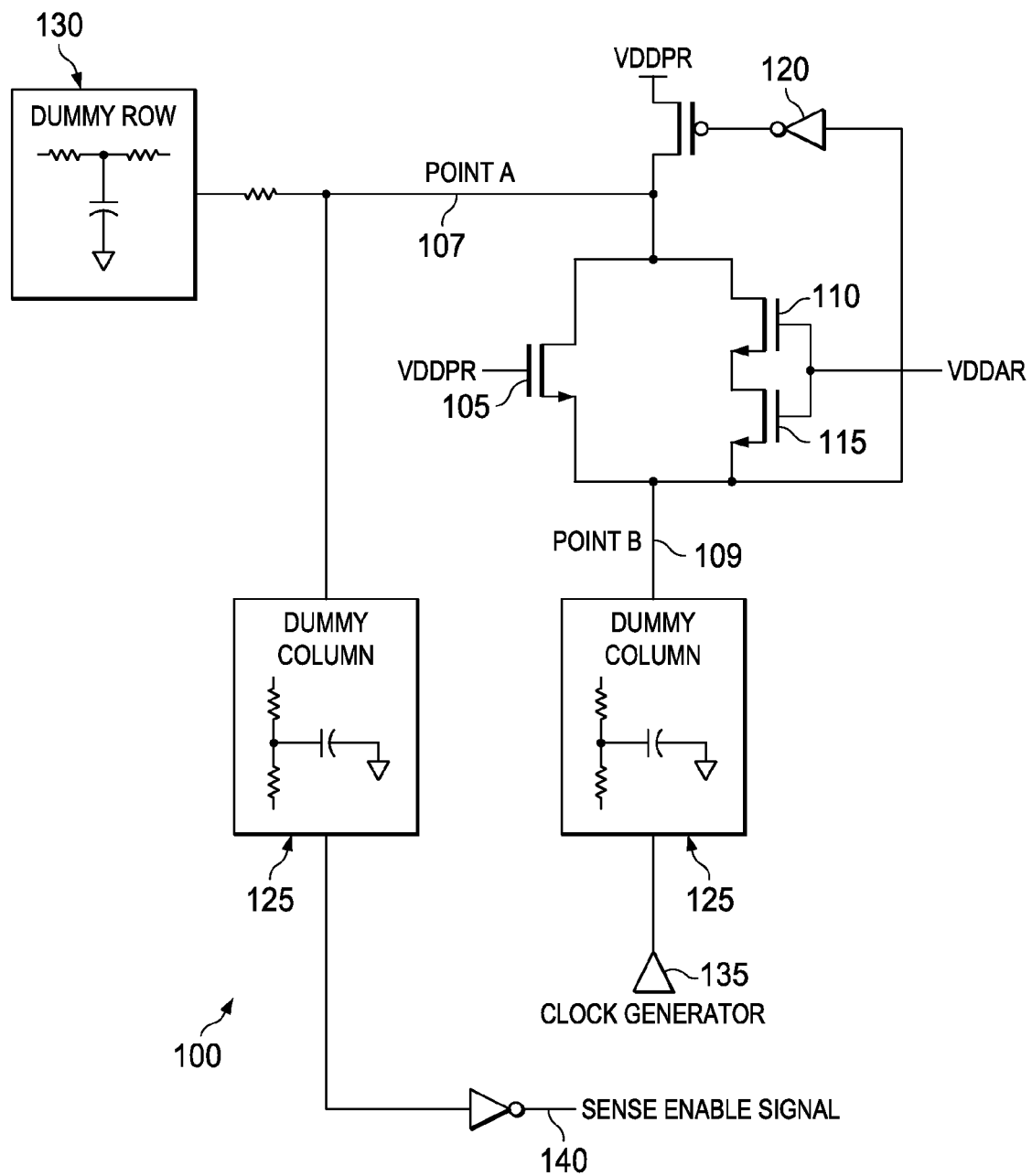
FIG. 1 illustrates a tracking circuit in a split-rail SRAM according to the prior art.
Figure 2:
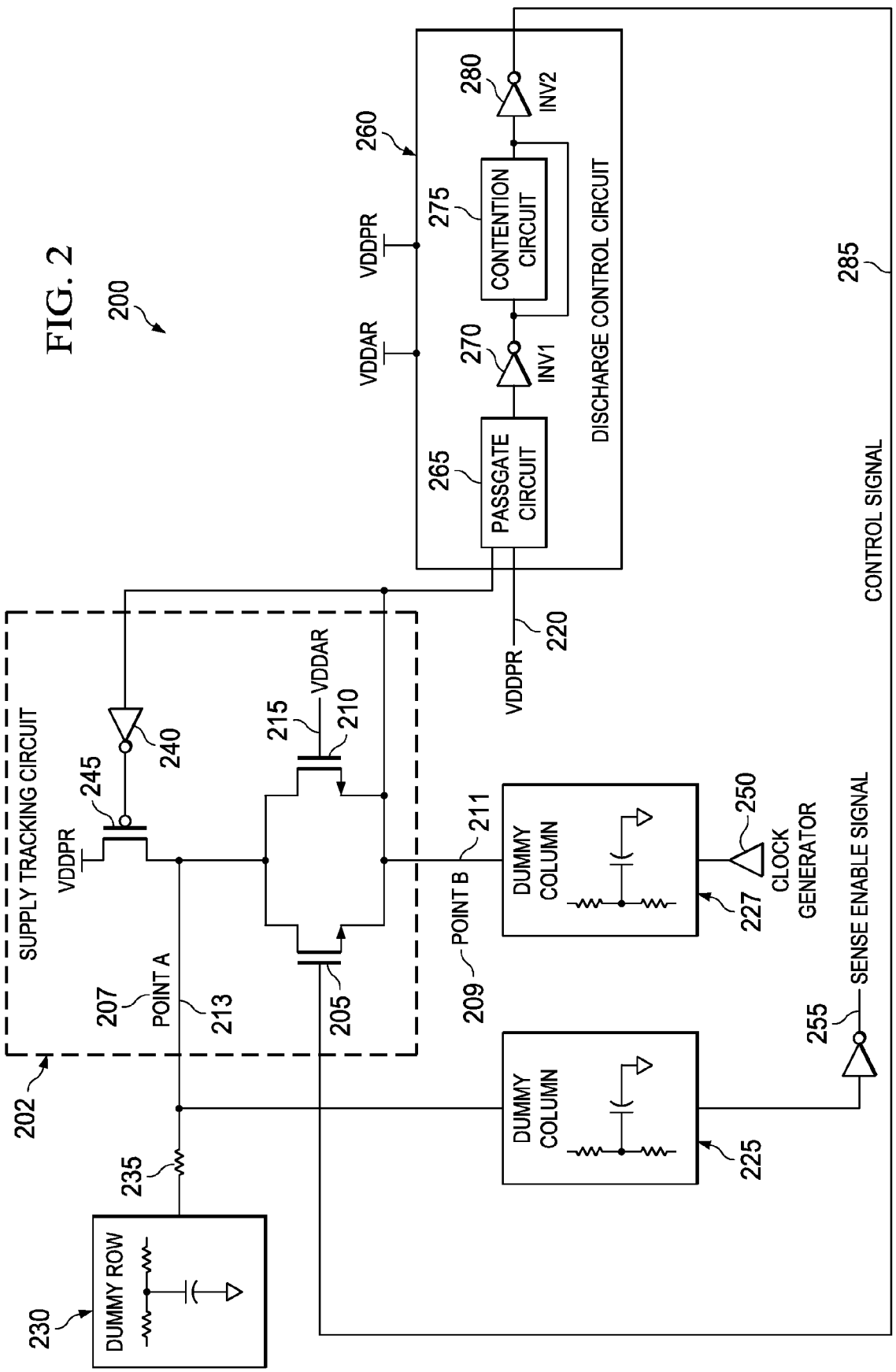
FIG. 2 illustrates a tracking circuit in a split-rail SRAM according to an embodiment.

FIG. 2 illustrates a tracking circuit 200 in the split-rail SRAM. The tracking circuit 200 includes a supply tracking circuit 202, a discharge control circuit 260, a set of dummy columns 225, 227 and a dummy row 230. The supply tracking circuit 202 includes two NMOS transistors, transistor 205 and transistor 210. Drains and sources of the transistors 205 and 210 are connected together. A gate of transistor 205 receives a control signal from the discharge control circuit on a line 285. A gate of the transistor 210 receives VDDAR on a line 215. In one embodiment, transistor 210 may be implemented as a series connection of two transistors having the gates coupled to each other and the gates receiving VDDAR.

The supply tracking circuit 202 further includes a PMOS transistor 245. A source of transistor 245 receives the VDDPR. A drain of transistor 245 is connected to drains of transistors 205 and 210. A gate of transistor 245 is connected to the sources of transistors 205 and 210 through an inverter 240. The dummy row 230 (row parasitic resistance and capacitance) is connected to the drain of the transistor 245 through a resistor 235 on a line 213. The dummy column 225 (column parasitic resistance and capacitance) is connected to the line 213. Point A, 207 is defined on the line 213. Similarly, another dummy column 227 is connected to the sources of transistors 205 and 210 on a line 211. Point B, 209 is defined on the line 211. A clock generator 250 is connected to the dummy column 227. An inverter 255 is connected to the dummy column 225 which outputs the sense enable (SE) signal for the sense amplifier (not shown in FIG. 2).

The discharge control circuit 260 includes a pass gate circuit 265, two inverters 270, 280 and a contention circuit 275. The discharge control circuit 260 receives VDDPR and VDDAR. The sources of transistors 205 and 210 are connected to the pass gate circuit 265. The VDDPR is also supplied to the pass gate circuit 265 on a line 220. An output of the pass gate circuit 265 is connected to the inverter 270. An output of the inverter 270 is connected to the inverter 280 directly and also through the contention circuit 275. An output of inverter 280 generates the control signal connected to the gate of transistor 205 on the line 285. Operation of the tracking circuit 200 according to an embodiment is explained as follows.

The rate of discharge current is controlled by two parallel paths using transistor 205 and transistor 210 which decides the discharge current through each path. The discharge path through the transistor 210 is controlled directly by VDDAR while the discharge path through transistor 205 is activated after certain delay. Value of this delay depends on the voltage corner (decided by the relative difference between VDDAR and VDDPR). Depending on the supply voltage, the rate of discharge current varies which in turn decides the generation of SE signals.

When relative difference between VDDAR and VDDPR is not significant, for example at VDDPR=0.99V and VDDAR=1.08V, the discharge control circuit 260 generates a delay with two inverters 270 and 280 that generates the control signal to transistor 205. When the VDDAR is higher than VDDPR, the discharge rate through transistor 205 is delayed as compared to transistor 210. In this case, the discharge control circuit 260 increases delay of activating the transistor 205. The contention circuit 275 is deactivated in this case.

On the other hand, when VDDPR is higher than VDDAR by significant margin, the contention circuit 275 is activated. The contention circuit 275 creates a contention and delays the activation of discharge path through the transistor 205. This way optimum tracking delay is maintained across all voltage corners. The discharge control circuit 260 generates the delayed control to the transistor 205 to compensate for the variation in delay across voltage corners. Operation of the discharge control circuit 260 is explained in more detail in FIG. 3, 300. As mentioned earlier, the tracking circuit 200 is tuned to give sufficient minimum differential voltage across (desired tracking delay) at voltage corner 0.99V-1.08V. This is the worst case voltage scenario from performance and power point of view. If the requirement is met in this corner, other corner will undoubtedly meet power, performance area and schedule (PPAS) requirements. Apart from this, the SRAM is also required to be functionally operational at lower voltage corner, for example at 0.75V-1.26V (VDDPR-VDDAR), but at a relaxed performance requirement.

Using this embodiment, sensitivity of delay due to supply voltage variation that results in generation of SE signal is significantly reduced. In other words, the tracking circuit 200 is less dependent on supply voltage variation. Further, a READ operation failure is eliminated which could possibly be caused due to speed up of sense tracking path. Also, the tracking circuit does not need to be optimized for the extreme voltage corners, which otherwise impacts the power and performance of the SRAM.

Figure 3:
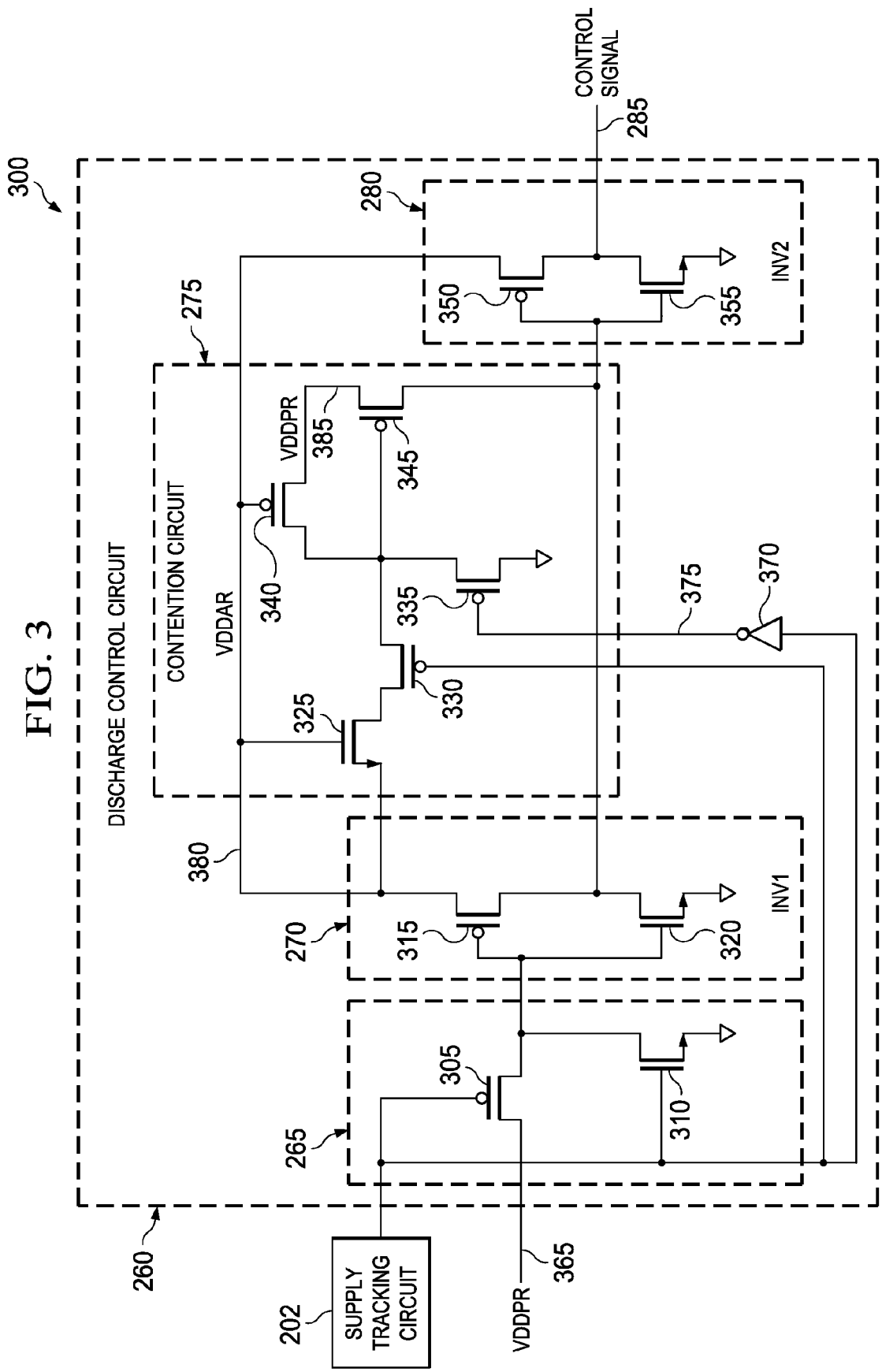
FIG. 3 illustrates an exemplary implementation of a discharge control circuit in the split-rail SRAM according to an embodiment.

FIG. 3 illustrates an exemplary implementation 300 of the discharge control circuit 260 in the split-rail SRAM. In general, the discharge control circuit 260 maintains optimum tracking delay in the supply tracking circuit 202. The discharge control circuit 260 includes the pass gate circuit 265, the inverter 270, the contention circuit 275 and another inverter 280. The pass gate circuit 265 includes a PMOS transistor 305 receiving VDDPR at a source on a line 365. A gate of the transistor 305 is connected to the supply tracking circuit 202 and also to a gate of an NMOS transistor 310. Drain of the transistor 310 is connected to the drain of the transistor 305. A source of the transistor 310 is grounded. The drains of the transistors 305 and 310 are connected to the inverter 270 (INV 1 as shown in FIG. 3).

The inverter 270 includes a PMOS transistor 315 and an NMOS transistor 320. Gates of the transistors 315 and 320 are connected to the drains of the transistors 305 and 310. A source of transistor 315 is connected to VDDAR. A source of transistor 320 is connected to ground. Drains of the transistors 315 and 320 are connected to each other and also to the inverter 280 (INV 2 as shown in FIG. 3). Similar to the inverter 270, the inverter 280 includes a PMOS transistor 350 and an NMOS transistor 355. Drains of the transistors 315 and 320 are connected to gates of the transistors 350 and 355. A source of the transistor 350 is connected to VDDAR and a source of the transistor 355 is connected to the ground. Drains of the transistors 350 and 355 are connected to each other. A control signal is generated from a common junction between the drains of the transistors 350 and 355 on the line 285.

The contention circuit 275 includes four PMOS transistors 330, 335, 340 and 345 and an NMOS transistor 325. A source and a gate of the transistor 325 is connected to each other and is also connected to VDDAR. A drain of the transistor 325 is connected to the drain of the transistor 330. A gate of the transistor 330 is connected to the supply tracking circuit 202 and a source is connected to the drain of the transistor 340. A gate of the transistor 340 is connected to VDDAR. Sources of the transistors 340 and 345 are connected to each other and also to VDDPR on a line 385. A gate of the transistor 345 is connected to the sources of the transistors 330 and 335. A drain of the transistor 345 is connected to the inverter 280. A drain of the transistor 335 is connected to the ground. A gate of the transistor 335 is connected to the supply tracking circuit 202 through an inverter 370. Operation of the discharge control circuit 260 according to an embodiment is explained in conjunction with the supply tracking circuit 202 of FIG. 2 as follows.

At a voltage corner, at which performance is quoted, for example, VDDPR=0.99V and VDDAR=1.08V, the dummy parasitic capacitance (dummy column 227) discharges through the transistor 210 and transistor 205. As point B (209) goes low, the discharge starts through transistor 210. Transistor 205 is in OFF state at this stage. It also results in generating delayed control for the transistor 205 which is activated after a small delay speeding up the remaining discharge left. The delayed control is generated by the control signal on the line 285. When point B, 209 goes low, it activates the PMOS transistor 305 of the passgate gate circuit 265. Transistor 305 passes VDDPR (as input on the line 365) and applies the voltage at the input of the inverter 270. As a result the control signal goes high. In this case the contention circuit 275 is deactivated.

At a voltage corner, when VDDPR is significantly lower than VDDAR, for example when VDDPR=0.75V and VDDAR=1.26V, discharge through transistor 210 of the supply tracking circuit 202 accelerates. According to an embodiment, transistor 205 is activated after a delay to compensate for the acceleration. In this case the transistor 305 of the pass gate circuit 265 applies VDDPR (0.75V, which is a lower drive voltage compared 0.99V) to the input of the inverter 270 thereby increasing the delay. Inverters 270 and 280 have a supply voltage of VDDAR (1.26V) at this voltage corner. VDDAR causes a contention in the inverter 270 between the transistors 315 and 320. This delays the control signal further. Transistor 320 of inverter 270 is implemented as a weak transistor so that it does not dominate over the transistor 315 and allow contention at the voltage corner (0.75V-1.26V).

When VDDPR is higher than VDDAR, for example at a voltage corner VDDPR=1.26V and VDDAR=1.08V, contention circuit 275 is activated. The decrease in delay (acceleration) due to higher VDDPR (1.26V) is compensated by creating a contention before the inverter 280, between the transistor 320 and the contention circuit 275. Transistor 335 lowers the voltage to 'VDDAR−Vt' (Vt=threshold voltage) which is then applied at the gate of the transistor 345. The transistor 345 is connected to VDDPR. This activates the transistor 345 and creates contention at this voltage corner. Input to the gate of the transistor 345 is clocked by the transistor 330 to prevent the voltage (VDDAR−Vt) charging up to VDDAR due to leakage.

In one embodiment, to prevent the possibility of direct current path in power management modes when VDDPR is high and VDDAR goes low, transistor 340 is used which pulls the gate of the transistor 345 high to VDDPR, leaving the transistor 345 in cut-off mode. In one embodiment, transistor 335 is used to pull the input of the transistor 345 to the threshold voltage (Vt) and thus avoids the transistor 345 being pulled to ground voltage (0V). If the transistor 345 is pulled to the ground voltage, the control signal will be delayed in the other voltage corners where contention is not required, for example 0.75V-1.26V and 0.99V-1.08V.

Figure 4:
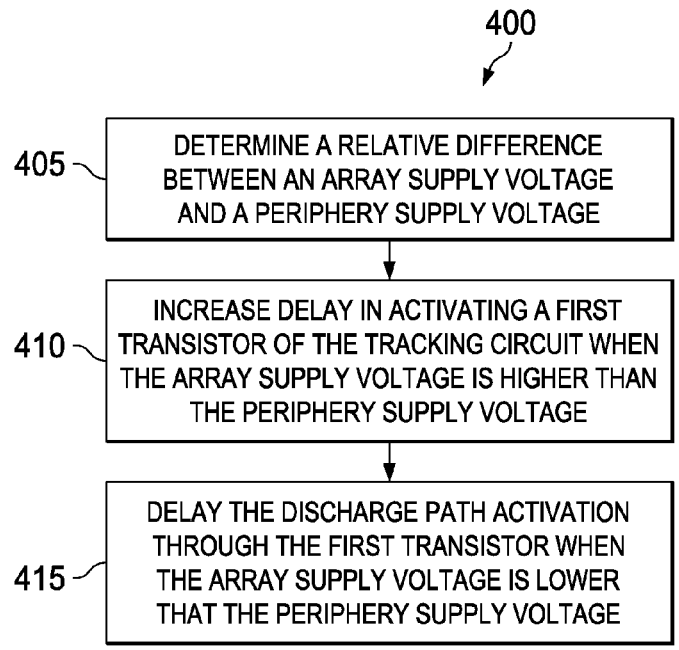
FIG. 4 is a flow diagram illustrating a method for compensating tracking delay across voltage corners in the split-rail SRAM according to an embodiment.

FIG. 4 is a flow diagram 400 illustrating a method for compensating tracking delay across voltage corners in the split-rail SRAM. At step 405, a relative difference between VDDAR and VDDPR is determined. Further, at step 410, delay in activating transistor 205 of the supply tracking circuit 202 is increased when VDDAR is higher than VDDPR. As explained earlier, the discharge rate through transistor 205 is delayed as compared to discharge rate through transistor 210. In this case, the discharge control circuit 260 increases delay of activating the transistor 205. At step 415, the discharge path activation through the transistor 205 is delayed when VDDAR is lower than VDDPR. The contention circuit 275 is activated in this case. The contention circuit creates a contention and delays the activation of discharge path through the transistor 205. This way optimum tracking delay is maintained across all voltage corners.

Figure 5:
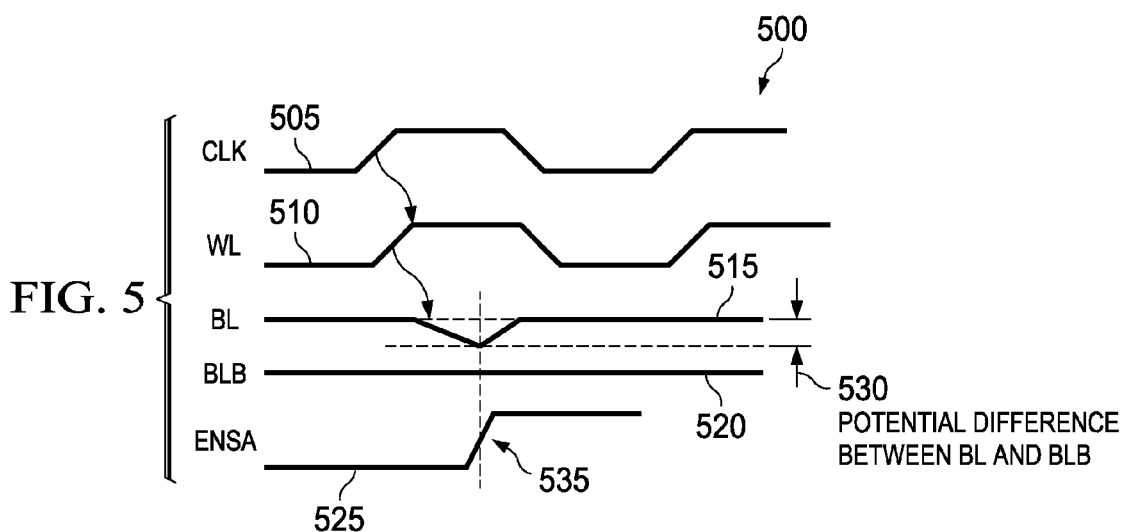
FIG. 5 is a timing diagram illustrating the operation of the tracking circuit according to an embodiment.

FIG. 5 timing diagram 500 illustrates the operation of the tracking circuit. The timing diagram 500 includes timings of a clock signal (CLK, 505), a word line (WL, 510), bit lines (BL, 515 and BLB, 520) and sense amplifier enable signal (ENSA, 525). When the split-rail SRAM is not accessed, WL, 510 is at logic low and BL, 515 is pre-charged to logic high. When SRAM bit cells are accessed, the CLK 505 goes to a logic high and WL, 510 goes to logic high. The WL signal (510) drives the SRAM bit cell. When WL, 510 goes to logic high, BL, 515 (bit line connected to a node storing logic 0) starts discharging through a bit cell pull down device. However, BLB, 520 stays at the supply voltage. This leads to a potential difference (530 as shown in FIG. 5) between BL, 515 and BLB, 520.

In the SRAM, the potential difference 530 between BL and BLB ideally should be higher than the offset voltage of the sense amplifier for correct sensing across any operating conditions. For a given bit cell and bit line load, the delay from WL 510 to ENSA 525 determines the difference between BL and BLB (515 and 520) and performance of the SRAM. An embodiment tries to maximize the potential difference between BL and BLB (515 and 520) across different voltage conditions of VDDAR and VDDPR with least WL to ENSA delay at a performance corner while maintaining adequate potential difference at different possible conditions of VDDAR and VDDPR. This increases the performance of the split-rail SRAM.

The results statistical mismatch simulation between the tracking circuit 200 of the invention and the conventional tracking circuit 100 is illustrated in FIG. 6, 600. The statistical mismatch simulation at weak process corner with 1.26V-1.08V, 0.99V-1.08V, 0.75V-1.26V and 0.75V-1.08V (VDDPR-VDDAR) supply voltages. In this statistical simulation, local mismatch is applied with a mean fixed at global weak process corner. The tracking circuit 200 and the conventional tracking circuit 100 are tuned to 50 mV differential voltage at 0.99V-1.08V corner. Ideally the tracking circuit should work up to a local mismatch which is equal to three sigma ($3\sigma$). For this target, figure of merit (FOM) should be greater than 3 (FOM>3). In order to meet the required FOM, minimum of 4-5 mV average differential is targeted at all voltage corners in the statistical mismatch simulation. FOM calculation is given below, $$FOM=[(\text{Avg. SA Differential})/(\text{standard deviation})]$$

Result of statistical mismatch is tabulated in FIG. 6. Table 1, 605 clearly shows that the conventional tracking circuit 100 does not meet the targeted FOM and there is a clear possibility of READ failure at low voltage corners (0.75V-1.08V, 0.75V-1.26V), which is highly undesirable. AVG −3σ in Table 1, 605 is negative at the low voltage corners. On the contrary, the tracking circuit 200 meets the desired FOM of greater than 3 with sufficient margin as shown in table 2, 610.

Further, the results obtained when the conventional circuit 100 is optimized just enough to avoid the possible READ failure and meet the targeted FOM (>3) is tabulated in table 3, 615. Straight comparison with table 4, 620 shows that tracking circuit 200 of the invention still has better margin and FOM at the low voltage corners (0.75V-1.08V, 0.75V-1.26V) where the original circuit was failing. Table 4, 620 brings out the impact on power and performance when the existing circuit is optimized meet the targeted FOM.

In the foregoing discussion, the term "connected" means at least either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A circuit comprising:
    a supply tracking circuit for tracking a delay required for generating sense amplifier enable signal in a memory, the supply tracking circuit receiving an array supply voltage and a periphery supply voltage;
    a discharge control circuit, operatively coupled to the supply tracking circuit, for increasing delay in activating a first transistor of the supply tracking circuit when the array supply voltage is higher than the periphery supply voltage; and
    a contention circuit comprising an output coupled to the first transistor, for delaying discharge path activation through the first transistor when the array supply voltage is lower than the periphery supply voltage.

2. The circuit of claim 1, wherein the discharge control circuit comprises a pass gate circuit, a first inverter and a second inverter, wherein the contention circuit is operatively coupled between the first inverter and the second inverter.

3. The circuit of claim 1, wherein the discharge control circuit and the contention circuit receive the array supply voltage and the periphery supply voltage.

4. The circuit of claim 1, wherein the supply tracking circuit comprises the first transistor coupled to a second transistor, wherein a gate of the second transistor receives the array supply voltage.

5. The circuit of claim 1, wherein the contention circuit delays the discharge path activation by activating a third transistor in response to a low array supply voltage, thereby creating a contention between the first inverter and the contention circuit.

6. The circuit of claim 1, wherein the contention circuit and the discharge control circuit maintains an optimum tracking delay across differences between the array supply voltage and the periphery supply voltage.

7. The circuit of claim 1, wherein the contention circuit is deactivated when the array supply voltage is higher than the periphery supply voltage.

8. The circuit of claim 1, wherein the memory comprises a split-rail static random access memory.

9. The circuit of claim 1, wherein the first transistor and the second transistor comprise an N type metal oxide semiconductor, the third transistor comprises a P type metal oxide semiconductor.

10. A discharge control circuit in a split-rail static random access memory comprising:
    a plurality of inverters for increasing delay in activating a transistor of a tracking circuit according to a relative difference between an array supply voltage and a periphery supply voltage; and
    a contention circuit that generates a delay in activating a discharge path through the transistor of the tracking circuit when the array supply voltage is lower than the periphery supply voltage, the contention circuit comprising a first transistor, a second transistor, a third transistor, and a fourth transistor coupled to each other;
    wherein a low array supply voltage activates the third transistor that creates a contention between the contention circuit and the plurality of inverters.

11. The discharge control circuit of claim 10, wherein the first transistor clocks the low array supply voltage to avoid an input third transistor charging to the array supply voltage.

12. The discharge control circuit of claim 10, wherein the second transistor pulls the gate of the third transistor high that avoids a direct current path in power management mode.

13. The discharge control circuit of claim 10, wherein the fourth transistor pulls the gate of the third transistor to a threshold voltage thereby preventing an input to the third transistor being pulled to a ground voltage.

14. The discharge control circuit of claim 10, wherein the plurality of inverters and the contention circuit activates the transistor through a control signal.

15. The discharge control circuit of claim 10, wherein the first transistor, the second transistor, the third transistor, and the fourth transistor comprises a P type metal oxide semiconductor.

16. The discharge control circuit of claim 13, wherein the contention circuit comprises a fifth transistor that lowers the voltage at the input to the third transistor to a value which is equal to a difference between array supply voltage and the threshold voltage.

17. A method comprising:
    determining a relative difference between an array supply voltage and a periphery supply voltage in a memory; and
    generating a delay that activates a discharge path of a tracking circuit in the memory according to the relative difference, wherein generating the delay comprises increasing delay in activating a first transistor of the tracking circuit when the array supply voltage is higher than the periphery supply voltage; and delaying the discharge path activation through the first transistor when the array supply voltage is lower than the periphery supply voltage.

* * * * *